United States Patent
van Wageningen et al.

(10) Patent No.: US 7,242,217 B2
(45) Date of Patent: Jul. 10, 2007

(54) OUTPUT REPORTING TECHNIQUES FOR HARD INTELLECTUAL PROPERTY BLOCKS

(75) Inventors: Darren van Wageningen, Kanta (CA); Curt Wortman, Ottawa (CA)

(73) Assignee: Altera Corporation, San Jose, CA (US)

(*) Notice: Subject to any disclaimer, the term of this patent is extended or adjusted under 35 U.S.C. 154(b) by 112 days.

(21) Appl. No.: 11/002,577

(22) Filed: Dec. 1, 2004

(65) Prior Publication Data

US 2006/0114022 A1  Jun. 1, 2006

(51) Int. Cl.
H03K 19/173 (2006.01)
H03K 19/177 (2006.01)
H03K 19/00 (2006.01)
G06F 7/38 (2006.01)
H01L 25/00 (2006.01)

(52) U.S. Cl. .............................. 326/40; 326/8; 326/37; 326/38; 326/39; 326/40; 326/41; 326/47; 380/287

(58) Field of Classification Search ............. 326/1–136
See application file for complete search history.

(56) References Cited

U.S. PATENT DOCUMENTS

| | | | |
|---|---|---|---|
| 5,825,202 A * | 10/1998 | Tavana et al. | 326/39 |
| 5,874,834 A | 2/1999 | New | |
| 6,091,262 A | 7/2000 | New | |
| 6,094,065 A | 7/2000 | Tavana et al. | |
| 6,242,945 B1 | 6/2001 | New | |
| 6,246,261 B1 * | 6/2001 | Monceau | 326/46 |
| 6,490,707 B1 | 12/2002 | Baxter | |
| 6,515,509 B1 | 2/2003 | Baxter | |
| 6,526,563 B1 | 2/2003 | Baxter | |
| 6,588,006 B1 * | 7/2003 | Watkins | 716/13 |
| 6,605,962 B2 * | 8/2003 | Lee et al. | 326/41 |
| 6,747,479 B1 * | 6/2004 | Coppola et al. | 326/41 |
| 6,769,109 B2 * | 7/2004 | Osann et al. | 716/17 |
| 6,845,139 B2 * | 1/2005 | Gibbons | 377/47 |
| 7,058,920 B2 * | 6/2006 | Lee et al. | 716/16 |
| 2004/0098643 A1 * | 5/2004 | Schulz | 714/718 |
| 2006/0033527 A1 * | 2/2006 | Lee et al. | 326/41 |
| 2006/0119386 A1 * | 6/2006 | Ng et al. | 326/41 |

OTHER PUBLICATIONS

"Atlantic Interface," Altera Functional Specification 13, version 3.0, Altera Corporation San Jose, CA (Jun. 2002).

(Continued)

*Primary Examiner*—Rexford Barnie
*Assistant Examiner*—Dylan White
(74) *Attorney, Agent, or Firm*—Townsend and Townsend and Crew LLP

(57) ABSTRACT

Techniques for reducing the frequency of an output signal from a hard intellectual property (HIP) block on an integrated circuit are provided. By reducing the frequency of the output signal, circuit blocks in the integrated circuit that operate at a lower frequency than the HIP block are able to capture the output signal. A plurality of serially coupled flip-flops store values of an HIP output signal during each period of the output signal. Logic circuitry then generates a lower frequency HIP output signal in response to the values stored in the flip-flops. Also, a flip-flop can generate a heartbeat signal that is used to determine whether a signal within an HIP block is operating properly.

20 Claims, 4 Drawing Sheets

OTHER PUBLICATIONS

"FPGAs & FPSCs from Lattice: ORSPI4," product information from http://www.latticesemi.com, Lattice Semiconductor Corporation Hillsboro, OR (2003), no month.

"ORCA® ORSPI4 Dual SPI4 Interface and High Speed Serdes FPSC," product information Lattice Semiconductor Corporation Hillsboro, OR (2004), no month.

System Packet Interface Level 4 (SPI-4) Phase 2; OC-192 System Interface for Physical and Link Layer Devices, Optical Internetworking Forum Implementation Agreement : OIF-SPI4-02.0 (Jan. 2001).

* cited by examiner

OUTPUT REPORTING TECHNIQUES FOR HARD INTELLECTUAL PROPERTY BLOCKS

BACKGROUND OF THE INVENTION

The present invention relates to techniques for reporting output signals from a hard intellectual property block, and more particularly, to techniques for reporting output signals from a hard intellectual property block at a lower frequency.

Programmable logic devices (PLDs) are a type of programmable logic integrated circuit. Programmable logic devices can be configured to perform a variety of logical user functions. Programmable logic integrated circuits also include field programmable gate arrays (FPGAs), programmable logic arrays, configurable logic arrays, etc.

PLDs typically have numerous logic blocks that can be configured to implement various combinatorial and sequential functions. The logic blocks have access to a programmable interconnect structure. The programmable interconnect structure can be programmed to interconnect the logic blocks in almost any desired configuration.

Many of today's PLDs have on-chip non-programmable application specific integrated circuit (ASIC) blocks. The ASIC blocks are also referred to as hard intellectual property (HIP) blocks. A HIP block typically operates at a higher clock frequency than the programmable logic in a PLD, because the interconnect wires between programmable logic blocks usually have longer routing delays than interconnect wires in an HIP block.

Many types of HIP blocks that are used in PLDs generate error signals that indicate whether erroneous values are being generated within the HIP block. Many types of HIP blocks also generate status signals that indicate operational states of circuits in the HIP block. A HIP block typically generates the status and error signals at the same frequency as the clock signal used in the HIP block.

For a particular embodiment, the internal clock frequency inside a HIP block configured as a System Packet Interface Level 4 Phase 2 (SPI4.2) processor running at Gbps is 500 MHz. Conversely, programmable logic within a PLD or FPGA typically has to operate at a lower clock frequency (e.g., 250 MHz), a timing requirement that is a side effect of the additional delays encountered with the interconnect wires and programmable Logic Elements (LE). As a result, it is not possible for the programmable logic to capture higher frequency (500 MHz) HIP block output signals that are transmitted in a single bit stream.

One option is to lower the frequency of the HIP block's clock signal. Reducing the frequency of the HIP block's clock signal affects the operation of logic circuitry in the HIP block and can mask timing violation bugs inside the HIP block. Therefore, this option by itself is not desirable.

Therefore, it would be desirable to provide techniques for capturing output signals from a hard intellectual property (HIP) block that operates at a higher clock frequency than programmable logic on the same integrated circuit.

Hardware debugging of an HIP block is difficult because the HIP block internal clock rate is higher than the programmable logic clock rate, as described above. It is desirable for a hardware engineer to check some or all of the HIP block input clock and reset signals. However, the standard methods of signal probing are difficult in the HIP block because of the speed limitations of the FPGA standard logic elements. Therefore, it would be desirable to provide a signal from the HIP block at a lower clock frequency that indicates whether various clock and reset signals are operating properly.

BRIEF SUMMARY OF THE INVENTION

The present invention provides techniques for reducing the frequency of an output signal from a hard intellectual property (HIP) block to be captured by standard logic in a programmable logic device. By reducing the frequency of the output signal, circuit blocks in the integrated circuit that operate at a lower frequency than the HIP clock signal are able to capture the output signal. The HIP output signals can be, for example, a status signal, error signal, or data signal.

The present invention also provides techniques to determine Hard Intellectual Property (HIP) clock and reset activity for both initial debug confidence and runtime operation.

According to one embodiment of the present invention, a plurality of serially coupled flip-flops store values from consecutive periods of a HIP block output signal. Logic circuitry generates a reduced frequency HIP output signal in response to the values stored in the flip-flops.

According to another embodiment of the present invention, a flip-flop generates a heartbeat signal that is used to determine whether clock and reset signals within a HIP block are operating properly.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
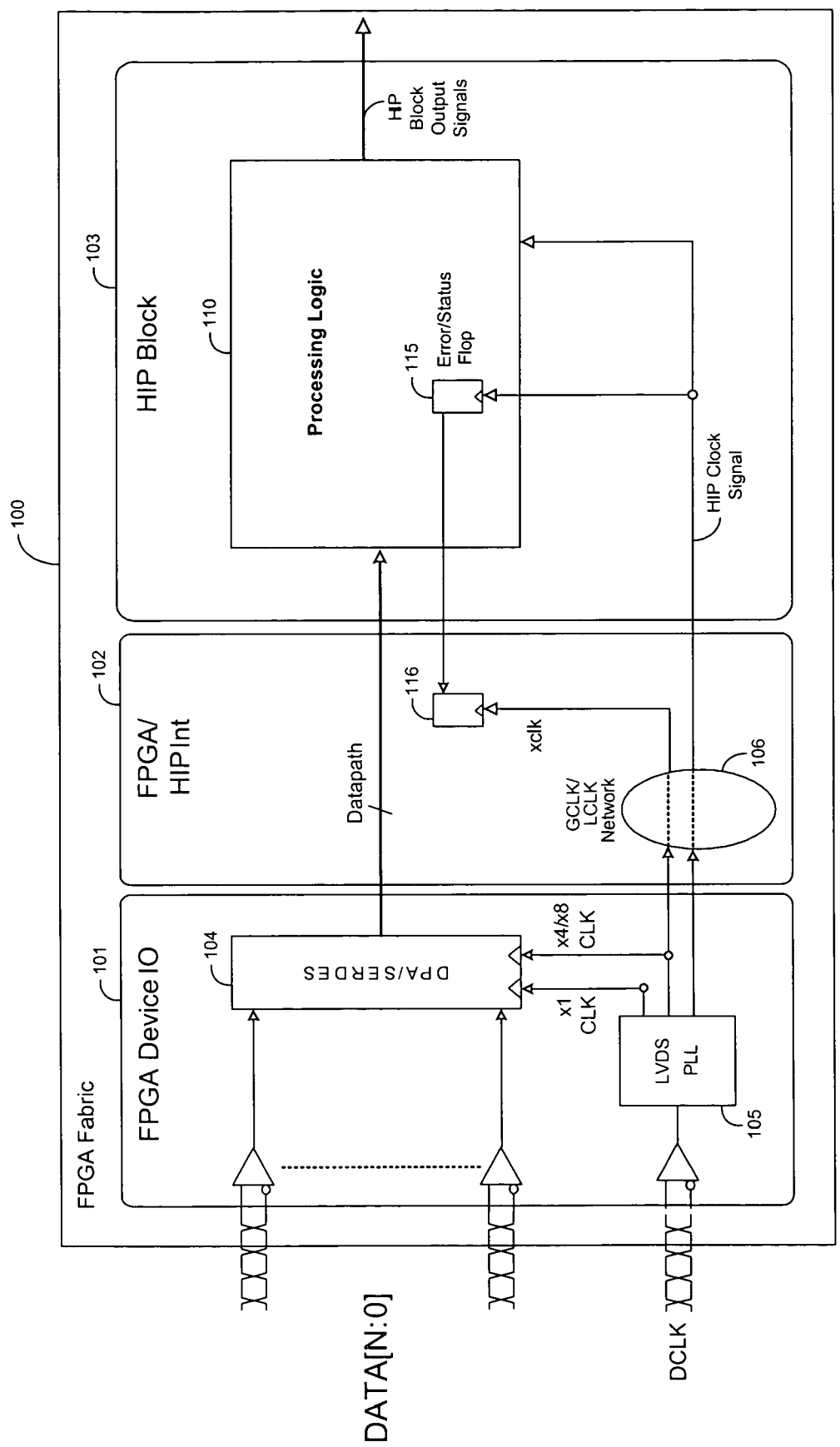
FIG. 1 illustrates an FPGA device I/O interface, an FPGA/HIP interface, and a HIP core block, all on an integrated circuit, according to an embodiment of the present invention.

FIG. 1 illustrates a portion of a programmable integrated circuit (IC) 100 that includes a hard intellectual property (HIP) block according to an embodiment of the present invention. IC 100 is a field programmable gate array (FPGA). Although the present invention is discussed primarily in the context of programmable logic integrated circuits such as PLDs and FPGAs, it should be understood the present invention is not limited to programmable logic integrated circuits. The techniques of the present invention can also be applied to application specific integrated circuits and other types of integrated circuits.

FPGA 100 includes input/output (I/O) block 101, FPGA/HIP interface block 102, and HIP core 103. I/O block 101 receives N bits of parallel input data DATA[N:0] through a input terminals (pins) of the integrated circuit. SERDES 104 de-serializes the data and outputs the de-serialized data to processing logic within HIP block 103 along a data path. In an alternative embodiment (not shown), the data flow has SERDES 104 serializing the data from the processing, and transmitting the serialized data from FPGA 100.

FPGA 100 also receives an external clock signal DCLK at an input pin as shown in FIG. 1. LVDS phase locked loop (PLL) 105 generates several on-chip clock signals in response to receiving the external DCLK signal. Some of the clock signals generated by PLL 105 drive SERDES 104. Other clock signals generated by PLL 105 are fed into a clock network 106 within the FPGA/HIP interface block 102. Clock network 106 routes various global and local clock signals within FPGA IC 100, including an xclk clock signal and the main HIP block clock. The xclk clock signal is an example of a clock signal that clocks programmable logic circuits within the programmable logic core circuitry of FPGA 100.

The HIP clock signal is the clock signal that is used to drive digital circuitry within HIP block 103. The HIP clock signal clocks logic circuitry within HIP processing logic 110 such as error/status flip-flop 115. Typically, the HIP clock signal has a higher frequency than the xclk clock signal and other clock signals that clock logic circuitry within FPGA 100. For example, the HIP clock signal may have a frequency of 500 MHz, and the xclk signal may have a frequency of 250 or 125 MHz (depending on the deserialization factor of x4 or x8 respectively).

HIP block 103 is an ASIC block within FPGA 100. HIP block 103 can be designed to perform any desirable functions. HIP block 103 generates various output signals, for example, error signals, status signals, and data output signals. These output signals (such as flip-flop 115) are transmitted to programmable logic circuitry within the FPGA such as flip-flop 116 for analysis. These output signals are generated at the frequency of the HIP clock signal, which is usually higher than the clock frequency of the FPGA's programmable logic circuits. The present invention provides techniques for reducing the frequency of output signals generated by HIP block 103 so that the output signals can be captured by programmable logic element 116 in FPGA 100.

Figure 2:
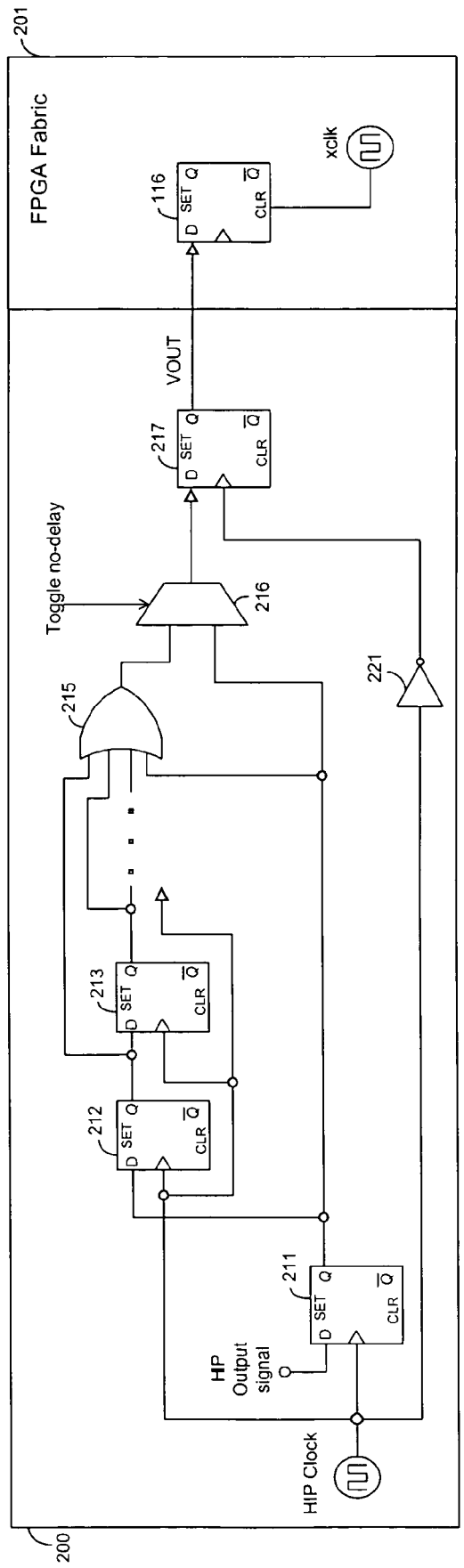
FIG. 2 illustrates a first embodiment of an HIP output signal reporting block that reduces the frequency of a HIP output signal according to the present invention.

FIG. 2 illustrates an example of a HIP output signal reporting block 200 that reduces the frequency of a HIP output signal according to an embodiment of the present invention. Block 200 includes OR gate 215, multiplexer 216, flip-flop 211, and one or more additional flip-flops (e.g., 212-213) that are coupled together in series.

Block 200 can include any number of flip-flops such as flip-flops 211-213 that are serially coupled together to reduce the frequency of an HIP block output signal by a corresponding fractional amount. For example, 4 flip-flops (including flip-flops 211-213 and one additional flip-flop coupled to the output of flip-flop 213) can be serially coupled to reduce the frequency of a HIP block output signal by ¼.

As another example, block 200 can have only two flip-flops 211-212 (flip-flop 213 being eliminated) to reduce the output signal by ½. As another example, eight flip-flops can be serially coupled together to reduce the frequency of a HIP block output signal by ⅛. The output voltages of each of the serially coupled flip-flops are combined using a logic gate such as OR gate 215.

Block 200 can also include an inverter 221 to make flop 217 negative edge clocked, but this is not a requirement. All flip-flops in block 200 are clocked on the HIP clock, which is typically faster than the xclk. For active low output signals, OR gate 215 is turned into an AND gate, otherwise the input to flop 211 will have to be inverted.

Flip-flop 211 receives an output signal of the HIP block at its D input terminal. The HIP output signal can be, for example, an error output signal, a status output signal, or a data output signal.

Flip-flops 211-213 receive the HIP clock signal at their clock input terminals. The voltage at the Q output terminal of flip-flop 211 is applied to the D input terminal of flip-flop 212. The voltage at the Q output terminal of flip-flop 212 is applied to the D input terminal of flip-flop 213. The voltage at the Q output terminal of flip-flop 213 is applied to the D input terminal of the next flip-flop or directly to an input of OR gate 215. The serially coupled flip-flops are clocked by the HIP clock signal.

The voltages at the Q output terminals of flip-flops 211-213 and any other flip-flops are applied to the inputs of OR gate 215. If any of the voltages at the Q outputs of these flip-flops are a logic high, the voltage at the output of OR gate 215 is a logic high. Thus, OR gate 215 combines data from X consecutive periods of the HIP output signal into one period (where X equals the number of serially coupled flip-flops). As a result, the period of the output signal of OR gate 215 is X times as long as the period of the HIP output signal and the period of the HIP clock signal. This implies a signal toggle frequency of the output signal of OR gate 215 is 1/X of the frequency of the HIP output signal and the HIP clock signal.

Multiplexer 216 receives the output signal of OR gate 215 at one of the multiplexer input terminals. Multiplexer 216 also receives the voltage at the Q output of flip-flop 211 at another one of the multiplexer input terminals. The state of the Toggle No-Delay signal determines which input signal multiplexer 216 passes to its output. This allows for selection of the cascaded signal output from flip-flops 211-213 or for the output from flip-flip 211 only (no-delay mode), providing the output signal at the HIP clock toggle frequency. The no-delay mode may be useful for obtaining the true values of the internal signals, while running the HIP at a slower rate so that there are no timing violations to flip-flop 116 clocked on the xclk domain. The no-delay mode may also be useful for multicycle signals that do not toggle every HIP clock cycle.

The output of multiplexer 216 is coupled to the D input of flip-flop 217. Flip-flop 217 registers the output signal of block 200 and generates registered output signal VOUT. Flip-flop 217 is clocked by the inversion of the HIP clock signal, so that it operates out of phase with flip-flops 211-213. Inverter 221 implies that flip-flop 217 operates on the inverted clock edge that flops 211-213 operate on, providing an improved timing margin for the output signal VOUT. Alternatively, inverter 221 can be eliminated, and flip-flop 217 can be clocked by a non-inverted HIP clock signal.

The voltage VOUT at the Q output of flip-flop 217 is transmitted to circuitry in FPGA fabric 201 such as flip-flop 116. Flip-flop 116 is clocked by FPGA clock signal xclk, which typically has a lower frequency than the HIP clock signal.

HIP reporting block 200 can be operated in one of two modes of operation by selecting the logic state of the Toggle No-Delay signal. When a user wants to capture the HIP output signal in circuitry residing in the FPGA fabric 201, the Toggle No-Delay signal is set to a first state. When the Toggle No-Delay signal is set to a first state, multiplexer 216 passes the output signal of OR gate 215 to the D input of flip-flop 217.

A disadvantage of operating block 200 in the first mode of operation is that OR gate 216 merges four values within every four periods of the HIP output signal into one value. This technique increases the chance that information could be lost. For example, the HIP output signal can be an error signal. If two errors occur in a row, the error signal will contain high values in two consecutive periods. Block 200 may merge two consecutive high values into one high value at the output of OR gate 216. As a result, two error values may be erroneously interpreted as one error value. As another example, four error values in a row may be merged into one single error pulse in VOUT if the deserialization factor is 4. In this example, the single error pulse in VOUT by itself cannot be distinguished from one, two, three or four separate error pulses in the HIP error output signal.

However, the techniques of the present invention are superior to prior art techniques. Prior art techniques failed to capture any values of an HIP block output error signal, because the frequency of the error signal was too fast for any of its values to be captured by the FPGA programmable logic, which was clocked at a lower frequency, when only 1 HIP I/O signal is available per status or error output. The techniques of the present invention allow programmable logic blocks in an FPGA to capture and analyze HIP output signals at a reduced frequency without having to reduce the frequency of the overall HIP clock signal, while keeping the HIP I/O pin count to a minimum.

Although some information in the HIP output signals may be lost in the frequency reduction process, the reduced toggle frequency VOUT signal contains a substantial amount of useful information. For example, if the HIP output signal is an error signal, VOUT being high in one period indicates that at least one error signal is occurring within X periods of the HIP error output signal (where X is determined by the deserialization factor of SERDES 104). Further analysis can then be performed to identify the cause of the error.

In the second mode of operation, the Toggle No-Delay signal is set to a second logic state when the user does not want to reduce the frequency of the HIP output signal. When the Toggle No-Delay signal is set to the second state, multiplexer 216 passes the Q output signal of flip-flop 211 to the D input of flip-flop 217. In this second mode of operation, the frequency of the VOUT signal is the same as the frequency of the HIP clock signal. The frequency of VOUT may be too high for flip-flop 116 to capture its values.

However, the second mode of operation can be used for other purposes. For example, the HIP output signal can be an error signal. In the first mode of operation, the VOUT signal may contain high pulses that indicate errors are occurring in the HIP block. If VOUT indicates errors are occurring, the frequency of the HIP clock signal can be reduced below its standard frequency to operate at a lower frequency (e.g., 125 MHz). Block 200 is then placed in the second mode of operation so that multiplexer 216 passes the error output signal from flip-flop 211 directly to flip-flop 217 at the same frequency as the HIP clock signal.

In the second mode of operation, error signals can be independently identified in each period of the error output signal. Operation in the second mode can hide timing violation bugs as mentioned above. However, by initially operating in the first mode, the timing violation bugs can be identified. By operating logic circuitry in the HIP block at a reduced clock signal frequency (e.g., 125 MHz) in the second mode of operation, programmable logic circuits in the FPGA fabric can capture output signals of flip-flop 217 at the nominal clock frequency of the programmable logic core.

According to a further embodiment of the present invention, OR gate 215 is replaced with another type of logic gate. As another example, OR gate 215 can be replaced with an OR-gate/multiplexer combination that selectively passes the Q output signals of the serially coupled flip-flops determined by the deserialization factor of SERDES 104. For example, a typical embodiment will contain 4 flip-flops in serial to support a deserialization factor of 8. However, if the deserialization factor is reduced to 4, then the multiplexer can select two of the flip-flops to be used for the inputs to the OR gate.

Another option is to transmit each of the output signals of the serially coupled flip-flops 211-213 separately (in parallel) to programmable logic in the FPGA fabric; this parallel output bus has a lower frequency than the HIP block output signal. The serially coupled flip-flops can divide an HIP block output signal into X parallel output data streams. Each parallel data stream contains data from one of every X periods of the HIP block output signal. The frequency of each parallel data output stream is 1/X the frequency of the HIP block output signal.

However, in the parallel output embodiment, the HIP block has to have X different output terminals per output signal, one for each of the parallel output signals. HIP blocks typically have a limited number of output terminals, and therefore, a solution that requires numerous output terminals is not desirable. As a specific example, a HIP block that generates ten separate error signals at the HIP clock frequency needs X times 10 output terminals to transmit 10X parallel error output signals that each have a frequency reduced by 1/X with respect to the HIP clock. p Also, the parallel output embodiment places a larger demand on the programmable routing resources in the FPGA. More routing resources are needed to transmit the X parallel output signals from the HIP block to the programmable logic blocks. Therefore, the embodiment of FIG. 2 is preferable.

Figure 3:
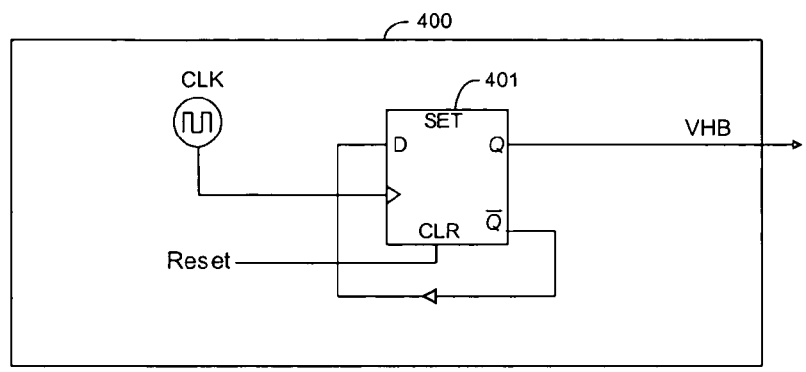
FIG. 3 illustrates a flip-flop that generates a heartbeat signal used for monitoring whether an HIP signal is operating properly, according to an embodiment of the present invention.

FIG. 3 illustrates another embodiment of the present invention. Block 400 includes a flip-flop 401 that generates a heartbeat signal VHB. The heartbeat signal VHB is used for monitoring whether a particular HIP signal is operating properly such as a HIP clock signal or a HIP reset signal.

Flip-flop 401 is clocked by an HIP clock signal CLK. A Reset signal controls the clear input of flip-flop 401. The Qbar output terminal is coupled to the D input terminal. A heartbeat signal VHB is generated at the Q output terminal.

Figure 4:
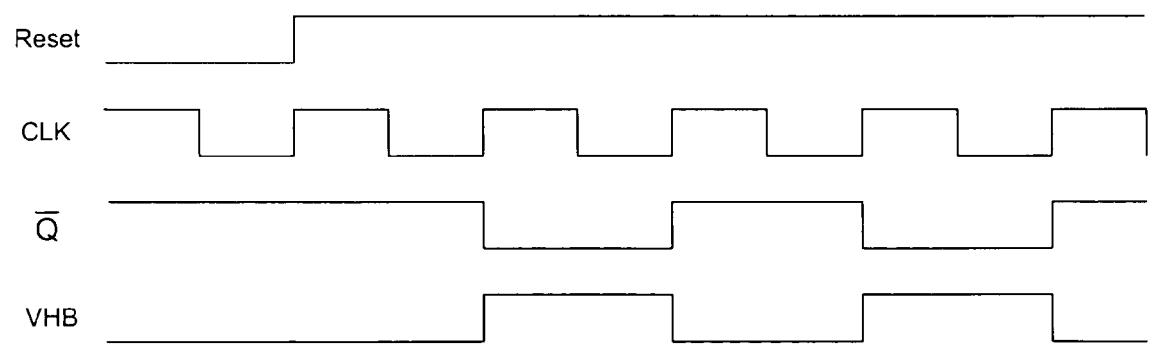
FIG. 4 is a timing diagram illustrating examples of waveforms that help to illustrate the operation of the embodiment of FIG. 4.

FIG. 4 is a timing diagram that illustrates the operation of the circuitry shown in FIG. 3. FIG. 4 illustrates example waveforms for four signals, Reset, CLK, Qbar, and VHB that effect the operation of block 400. On the next clock cycle following the rising edge of Reset, the Q output goes to a logic low, and the Qbar output goes to a logic high. On each rising edge of CLK, flip-flop 401 passes the voltage of the Qbar signal at its D input to its Q output. The waveforms shown in FIG. 4 illustrate examples of the relationships between these signals.

The heartbeat signal VHB provides an easy way for a hardware design engineer to ensure that the HIP block clock and reset signals are properly configured in the HIP block.

The heartbeat signal VHB also allows an engineer to verify that the clock and reset trees have been properly routed inside the HIP block.

In the example shown in FIG. 4, the heartbeat signal VHB has one-half the frequency as the HIP CLK clock signal. The frequency of the heartbeat signal can be reduced further so that it can be captured in FPGA programmable logic elements by using a frequency divider or a counter circuit. A counter or a divider circuit can be used to divide the frequency of VHB. A frequency divider, for example, can divide the frequency of the heartbeat signal by 2 or by 4 so it can be captured by the logic elements.

The counter or divider circuit can be controlled by the reset signal. The divided VHB signal is then sent to LE fabric (e.g., programmable logic blocks). A user can implement detection logic to report and handle system failures. A benefit of the FIG. 3 embodiment is that both a clock signal and a reset signal are monitored simultaneously.

Thus, flip-flop 401 oscillates in a desired clock domain. Flip-flop 401 is optionally reset based on a desired reset signal. There can be a flip-flop that generates a heartbeat signal for every clock domain in an HIP block on an FPGA. If flip-flops in a clock domain have different reset signals, a unique heartbeat signal can be generated for each of these conditions using a separate flip-flop such as flip-flop 401.

A hardware debug engineer can capture the heartbeat signal VHB after reset to ensure that the HIP block is operating, and that the clock and reset signals are properly driven. Another advantage of the FIG. 3 embodiment is that the heartbeat signal VHB can be promoted to a global clock network, and used as a clock signal. This can be useful for capturing HIP status output signals or driving some HIP input signals, because the heartbeat signal is essentially synchronized to the HIP clock signals.

Figure 5:
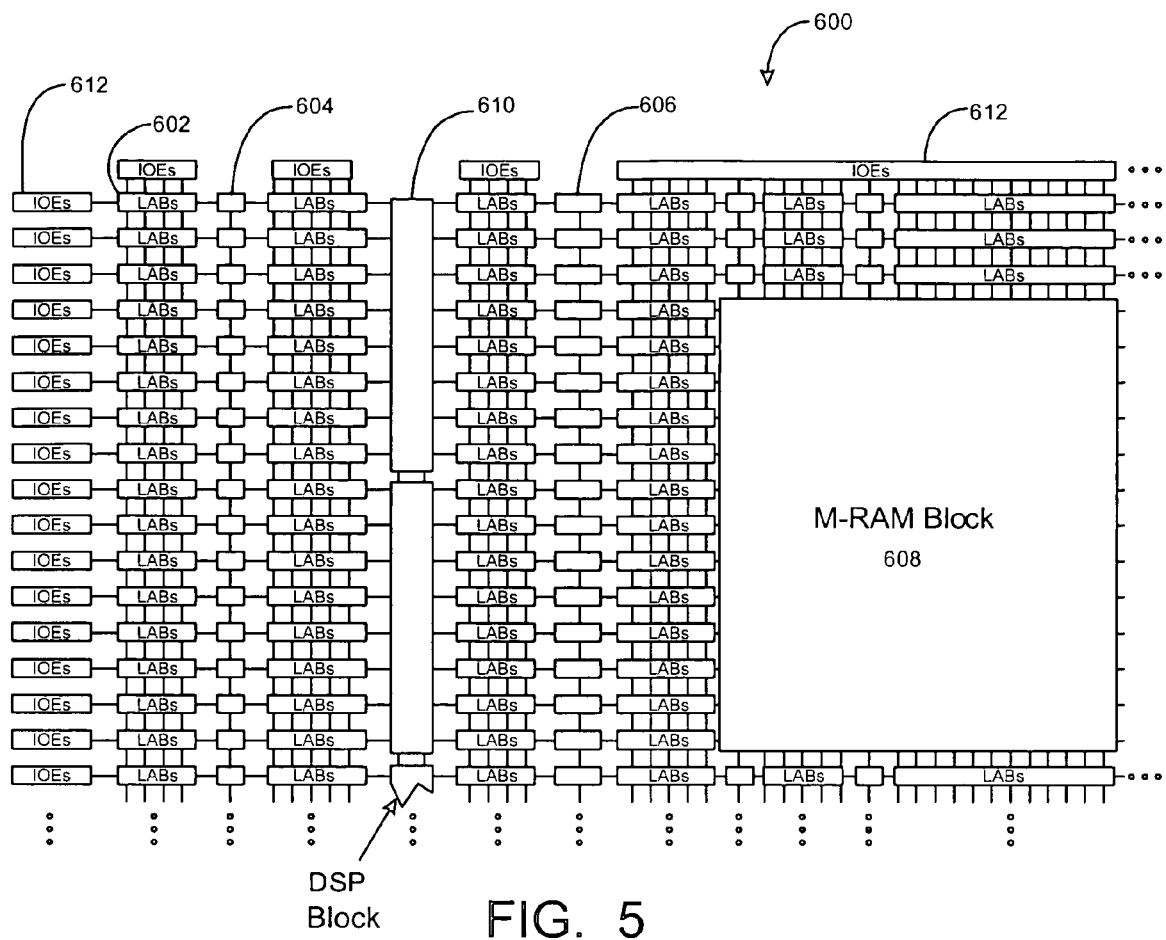
FIG. 5 is a simplified block diagram of a programmable logic device that can be used with the techniques of the present invention.

FIG. 5 is a simplified partial block diagram of one example of PLD 600 that can include aspects of the present invention. Although the present invention is discussed primarily in the context of PLDs and FPGAs, it should be understood that the present invention can be applied to numerous types of programmable integrated circuits. PLD 600 is an example of a programmable integrated circuit in which techniques of the present invention can be implemented. PLD 600 includes a two-dimensional array of programmable logic array blocks (or LABs) 602 that are interconnected by a network of column and row interconnects of varying length and speed. LABs 602 include multiple (e.g., 10) logic elements (or LEs).

An LE is a programmable logic block that provides for efficient implementation of user defined logic functions. PLD has numerous logic elements that can be configured to implement various combinatorial and sequential functions. The logic elements have access to a programmable interconnect structure. The programmable interconnect structure can be programmed to interconnect the logic elements in almost any desired configuration.

PLD 600 also includes a distributed memory structure including RAM blocks of varying sizes provided throughout the array. The RAM blocks include, for example, 512 bit blocks 604, 4K blocks 606 and a block 608 providing 512K bits of RAM. These memory blocks can also include shift registers and FIFO buffers.

PLD 600 further includes digital signal processing (DSP) blocks 610 that can implement, for example, multipliers with add or subtract features. I/O elements (IOEs) 612 located, in this example, around the periphery of the device support numerous single-ended and differential I/O standards. It is to be understood that PLD 600 is described herein for illustrative purposes only and that the present invention can be implemented in many different types of PLDs, FPGAs, and the like.

Figure 6:
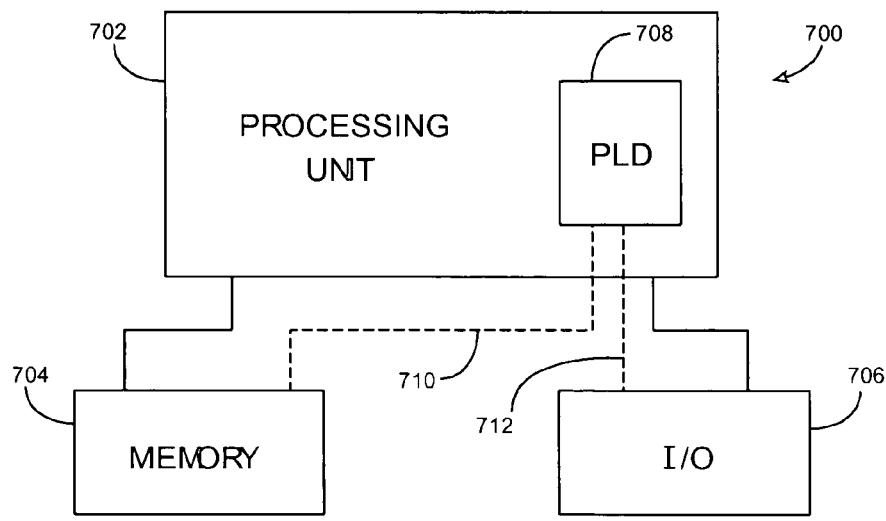
FIG. 6 is a block diagram of an electronic system that can implement embodiments of the present invention.

While PLDs of the type shown in FIG. 5 provide many of the resources required to implement system level solutions, the present invention can also benefit systems wherein a PLD is one of several components. FIG. 6 shows a block diagram of an exemplary digital system 700, within which the present invention can be embodied. System 700 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 700 can be provided on a single board, on multiple boards, or within multiple enclosures.

System 700 includes a processing unit 702, a memory unit 704 and an I/O unit 706 interconnected together by one or more buses. According to this exemplary embodiment, a programmable logic device (PLD) 708 is embedded in processing unit 702. PLD 708 can serve many different purposes within the system in FIG. 6. PLD 708 can, for example, be a logical building block of processing unit 702, supporting its internal and external operations. PLD 708 is programmed to implement the logical functions necessary to carry on its particular role in system operation. PLD 708 can be specially coupled to memory 704 through connection 710 and to I/O unit 706 through connection 712.

Processing unit 702 can direct data to an appropriate system component for processing or storage, execute a program stored in memory 704 or receive and transmit data via I/O unit 706, or other similar function. Processing unit 702 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 708 can control the logical operations of the system. In an embodiment, PLD 708 acts as a reconfigurable processor, which can be reprogrammed as needed to handle a particular computing task. Alternately, programmable logic device 708 can itself include an embedded microprocessor. Memory unit 704 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. A programmable logic integrated circuit comprising:
   a hard intellectual property (HIP) block that generates a HIP output signal;

a plurality of serially coupled flip-flops that store values of the HIP output signal at consecutive periods;

logic circuitry that generates a reduced frequency HIP output signal in response to receiving the values stored in the plurality of serially coupled flip-flops; and a register in a programmable logic block that captures values of the reduced frequency HIP output signal.

2. The programmable logic integrated circuit according to claim 1 wherein the logic circuitry further comprises an OR gate for active high signals or an AND gate for active low signals coupled to output terminals of each of the plurality of serially coupled flip-flops.

3. The programmable logic integrated circuit according to claim 2 wherein the plurality of serially coupled flip-flops includes X flip-flops, and a frequency of the reduced frequency HIP output signal is 1/X times a frequency of the HIP output signal.

4. The programmable logic integrated circuit according to claim 2 wherein the logic circuitry further comprises a multiplexer having a first input coupled to an output of the OR gate or the AND gate.

5. The programmable logic integrated circuit according to claim 4 wherein a second input of the multiplexer is coupled to an output terminal of a first one of the plurality of serially coupled flip-flops.

6. The programmable logic integrated circuit according to claim 4 wherein the logic circuitry further comprises an output flip-flop coupled to an output of the multiplexer.

7. The programmable logic integrated circuit according to claim 1 wherein the plurality of serially coupled flip-flops comprise four serially coupled flip-flops.

8. The programmable logic integrated circuit according to claim 1 wherein the HIP output signal is an output signal of an output flip-flop.

9. A method for reducing the frequency of an output signal of a hard intellectual property (HIP) block on a programmable logic integrated circuit, the method comprising:

generating a HIP output signal from an HIP block on a programmable logic integrated circuit;

storing values of the HIP output signal in consecutive periods of the HIP output signal;

generating a reduced frequency HIP output signal in response to at least two of the values of the HIP output signal at consecutive periods; and capturing values of the reduced frequency HIP output signal at each period of the reduced frequency HIP output signal in a programmable logic portion of the programmable logic integrated circuit.

10. The method defined in claim 9 wherein storing the values of the HIP output signal at consecutive periods of the HIP output signal further comprises:

storing the values of the HIP output signal in a plurality of serially coupled flip-flops.

11. The method defined in claim 10 wherein generating the reduced frequency HIP output signal further comprises:

combining the values of the HIP output signal stored in the flip-flops using a logic gate.

12. The method defined in claim 11 wherein generating the reduced frequency HIP output signal further comprises:

selecting an output signal of the logic gate or an output signal of a first one of the plurality of serially coupled flip-flops using a multiplexer.

13. The method defined in claim 12 wherein generating the reduced frequency HIP output signal further comprises:

storing an output signal of the multiplexer in an output flip-flop.

14. The method defined in claim 10 wherein the plurality of serially coupled flip-flops are clocked by a clock signal of the HIP block, and the programmable logic integrated circuit is clocked by a programmable logic clock signal.

15. The method as defined in claim 10 wherein the plurality of serially coupled flip-flops includes X flip-flops, and the HIP output signal has a frequency that is X times a frequency of the reduced frequency HIP output signal.

16. The method as defined in claim 9 wherein the HIP output signal is an error output signal of the HIP block.

17. The method as defined in claim 9 wherein the HIP output signal is a output signal of a flip flop.

18. A programmable logic integrated circuit comprising:

an ASIC block that generates a first output signal;

a plurality of serially coupled flip-flops that store values of the first output signal at consecutive periods of the first output signal;

a logic gate having inputs coupled to outputs of each of the serially coupled flip-flops and generating a second output signal having a lower frequency than the first output signal; and a programmable logic block that stores values of the second output signal, wherein a register in the programmable logic block is clocked at a lower frequency than the serially coupled flip-flops.

19. The programmable logic integrated circuit defined in claim 18 further comprising:

a multiplexer having a first input coupled to an output of the logic gate and a second input coupled to a first one of the serially coupled flip-flops.

20. The programmable logic integrated circuit defined in claim 19 further comprising:

an output flip-flop having an input coupled to an output of the multiplexer and an output coupled to an input of the register.

* * * * *